(12) United States Patent
Metzler

(10) Patent No.: US 7,535,279 B2
(45) Date of Patent: May 19, 2009

(54) VERSATILE CONTROL PIN ELECTRONICS

(75) Inventor: Crispin Metzler, Woburn, MA (US)

(73) Assignee: Analog Devices, Inc., Norwood, MA (US)

(*) Notice: Subject to any disclaimer, the term of this patent is extended or adjusted under 35 U.S.C. 154(b) by 565 days.

(21) Appl. No.: 11/294,747

(22) Filed: Dec. 6, 2005

(65) Prior Publication Data

US 2006/0150045 A1 Jul. 6, 2006

Related U.S. Application Data

(60) Provisional application No. 60/633,882, filed on Dec. 7, 2004.

(51) Int. Cl.
*H03L 5/00* (2006.01)
(52) U.S. Cl. ..................... 327/309; 327/321
(58) Field of Classification Search ........... 327/306, 327/309, 321, 331
See application file for complete search history.

(56) References Cited

U.S. PATENT DOCUMENTS

| | | | |
|---|---|---|---|
| 3,818,244 A | * | 6/1974 | Dolby et al. ............ 327/328 |
| 5,546,016 A | * | 8/1996 | Allen .................... 326/30 |
| 5,770,964 A | * | 6/1998 | Suma .................... 327/328 |
| 5,856,760 A | * | 1/1999 | Lam et al. ............... 330/298 |
| 6,897,702 B2 | * | 5/2005 | Khieu et al. ............. 327/313 |

OTHER PUBLICATIONS

"Integrated Pin Electronics for VLSI Functional Testers," *IEEE Journal of Solid-State Circuits*, vol. 24, No. 2, Apr. 1989, pp. 331-337/.

* cited by examiner

*Primary Examiner*—Dinh T. Le
(74) *Attorney, Agent, or Firm*—Bromberg & Sunstein LLP

(57) ABSTRACT

Versatile control pin electronics are disclosed. The control pin electronics are coupled to a control pin and allow for the passing of both analog and digital control signals. The control pin electronics work with digital logic having logic levels that are compatible with analog signals having predefined voltage and current limits. The versatile control pin electronics include both a voltage regulator that sets a regulated voltage at the control pin and a current limiter. The versatile control pin electronics can be coupled to a comparator to provide both hysteresis and latching functionality from a single pin.

14 Claims, 8 Drawing Sheets

In this example saturating depletion mode CMOS devices form the limiter and control currents are derived from currents flowing in the regulator supply terminals Versatile Input Pin Versatile Input Pin

VERSATILE CONTROL PIN ELECTRONICS

CROSS REFERENCE TO RELATED APPLICATIONS

The present U.S. Patent Application claims priority from U.S. Provisional Patent Application No. 60/633,882 filed on Dec. 7, 2004 entitled, "Versatile Control Pin", which is incorporated herein by reference in its entirety.

TECHNICAL FIELD AND BACKGROUND ART

The present invention relates to control pins and in certain embodiments to control pins for comparators. It is known in the prior art to have control pins attached to electronic circuits for providing an input point for receiving a control signal. Normally, control pins and control pin electronics are designed to receive either an analog signal or a digital signal, but not both.

It has been common practice for electronics manufacturers to suggest applying analog bias voltages or currents to comparator latch inputs (control pins) in order to obtain hysteresis effects. Although hysteresis occurs when a bias voltage or a current is applied to a comparator latch, the hysteresis is not controllable over usable ranges due to fluctuating voltage levels at the control pin.

More recently comparators have been constructed that have two pins; one pin used for hysteresis and the other pin used for latching. With these embodiments the hysteresis functionality was well regulated, but the current/voltage characteristics of the two pins prevented combination of the two into one single pin. In some cases, an attempt to do so would result in damage to the device being controlled.

SUMMARY OF THE INVENTION

In one embodiment of the invention, a system for use with an electronic circuit is disclosed. The system includes a control pin module that can accept both digital and analog input signals. The control pin module includes a control pin input, a voltage regulator and a current limiter. The voltage regulator maintains the control pin input at a predetermined voltage. The current limiter limits the current through the control pin input to no greater than a maximum value. By having a well regulated voltage, a defined current can be introduced into the control pin input. By limiting the current to a maximum current into the control pin input using the current limiter, a well-defined transfer function is created for the control pin module. Thus, the control pin module can receive an analog signal having a defined current range and can also receive a digital input signal for digital logic that has a voltage range beyond that for the analog signal, but will be required to supply current levels no higher than those set by the current limiter element(s).

In certain embodiment the control pin module can be coupled to a comparator wherein the input receives both an analog input signal for hysteresis and a digital input signal to provide latching. Thus, the control pin module enables a single pin to perform both hysteresis and latching for a comparator. In other embodiments of the invention, the comparator may include a comparison module electrically coupled to a feedback module that controls an output module. The output module produces the output signal from the comparator. The comparison module includes first and a second comparator inputs for receiving in a first and a second input signal and produces a comparison module output signal. The feedback module receives the comparator output and feeds back the comparator output to the output module to regulate the comparator output.

By coupling the control pin module to the feedback module, the control pin module can control the feedback and therefore the output of the comparator. If the feedback back is operated with a maximum input current defined by a digital input signal, the feedback module will overwhelm the operation of the comparator and will cause the output of the comparator to latch to the value produced by the comparator when the maximum current is introduced. If an analog input current that is well below the maximum current for the current limiter is presented to the feedback module, the feedback module can be adjusted to provide more or less feedback. As a result of the feedback, a controlled hysteresis process can be generated for the comparator.

In certain embodiments, the control pin module may be formed from bi-polar transistors, CMOS transistors, or a combination of bi-polar and CMOS transistors. In one embodiment the feedback module and the comparison module are formed from bi-polar transistor pairs and the control pin module provides current to the emitter junctions of the bi-polar transistors of the feedback module. In such a configuration, the transistors of the comparison module are in a differential pair configuration and the input signals are received into the bases of the transistors. Additionally, the output stage may include a pair of transistors wherein each transistor has a control terminal and each control terminal of the output stage transistors is electrically coupled to one of the transistors in the comparison module.

In alternative embodiments, the maximum current of the current limiter can be adjusted by changing a bias voltage. In embodiments of the invention, the current limiter can include a current mirror. The current limiter can alternatively be constructed from a pair of complementary CMOS transistors where the gate and drain of both transistors are electrically coupled together.

The control pin input and the accompanying control pin electronics may be used with any of a number of different electronic circuits. A method for using a control pin electronics is described below. A regulated voltage is provided at the control pin. An input control signal is provided to the control pin and the current through the control pin is limited by a current limiter to a predefined current limit. The input control signal can be an analog input signal or a digital input signal where the analog input signal has an associated operational current range and the digital input signal is part of a digital logic family having an operational current range that is above that of the operational current range for the analog input signal, but below the maximum input current defined by the current limiter. As a result, the control pin electronics are compatible with both analog and digital input signals and can control associated analog and digital circuitry. In certain embodiments, there are separate analog and digital outputs from the control pin electronics. It should be understood by one of ordinary skill in the art that the control pin electronics can be constructed in a number of different ways using different logic without deviating from the intended scope of the invention. For example, the control pin electronics may include a current limiter that limits the current to a minimum level and the digital logic levels are below that of the operative analog range or rather than limiting current, the voltage may be limited and the analog voltage range and the digital voltage range would need to be compatible.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

One embodiment of the invention is a versatile control pin electronics that may be used with both analog and digital input signals. The control pin electronics are designed to provide a fixed current transfer function at a well regulated terminal voltage over the desired analog control current range. This range of current should be less than that specified for the desired digital logic family to be emulated. Beyond this analog control range the voltage/current characteristic and switching threshold(s) are made compatible with the logic family. The control pin and accompanying electronics may be connected to a comparator to provide both digital latching and analog hystersis control. Both functions are combined into the same pin by providing a voltage regulator and a current limiter at the pin.

Figure 1:
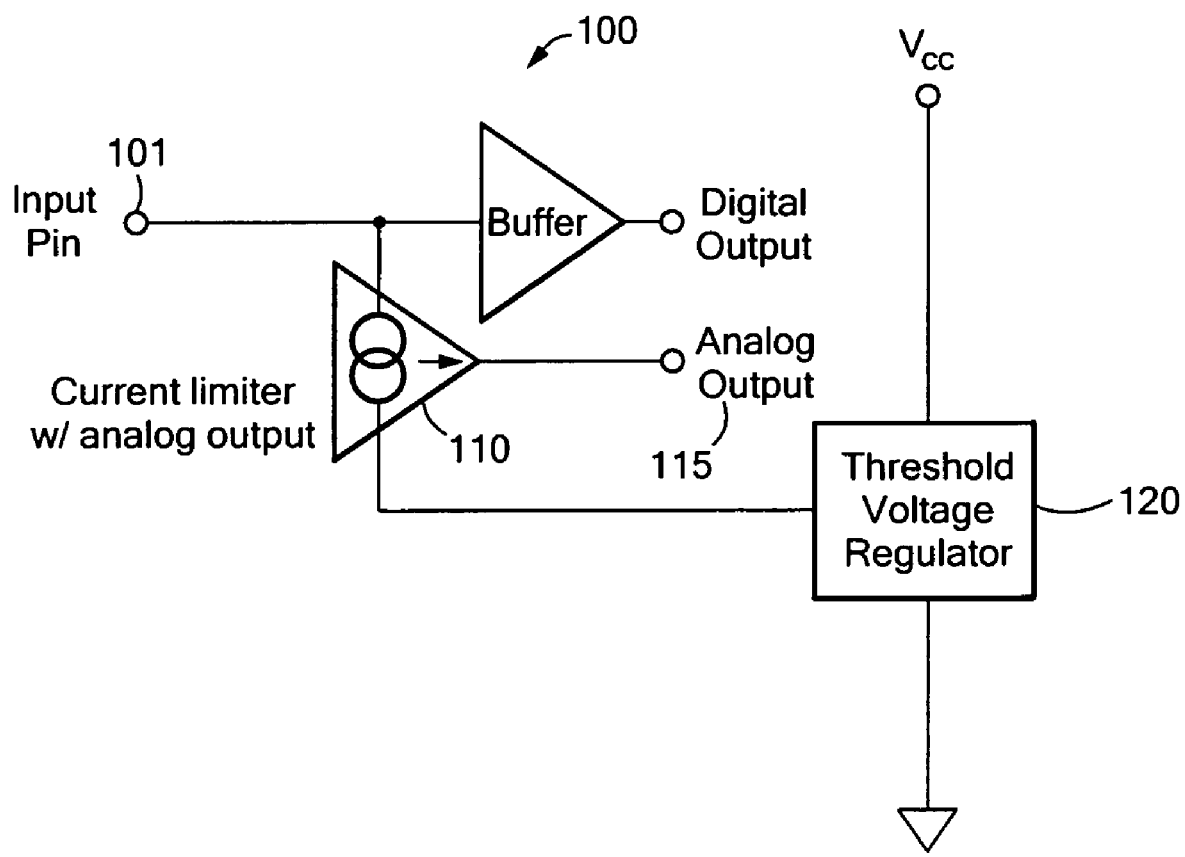
FIG. 1 is a schematic diagram showing a first embodiment of the control pin electronics.

FIG. 1 is a schematic diagram showing a first embodiment of the control pin electronics 100. The control pin 101 is designed to receive as input both analog and digital signals. The digital logic family and the operative analog signal range must be compatible. For example, the operative analog range may be between −130 and 130 micro amps with a voltage swing between 1 and 1.5 V whereas a digital logic level may be at 130 micro amps and 5V. Thus, the analog and digital regions can overlap, but only at the limits of the operative analog region and preferably do not overlap. The input pin 101 receives the analog or digital input signal. Coupled to the input is a current limiter 110 that limits the amount of current that is presented to the analog output 115. By limiting the current, the analog electronics that may be attached to the analog output 115 is preserved. Also attached to the input pin is a voltage regulator 120. The voltage regulator 120 regulates the voltage at the input pin 101 to a set level under normal conditions. Thus, the analog signal can be easily regulated.

Figure 2:
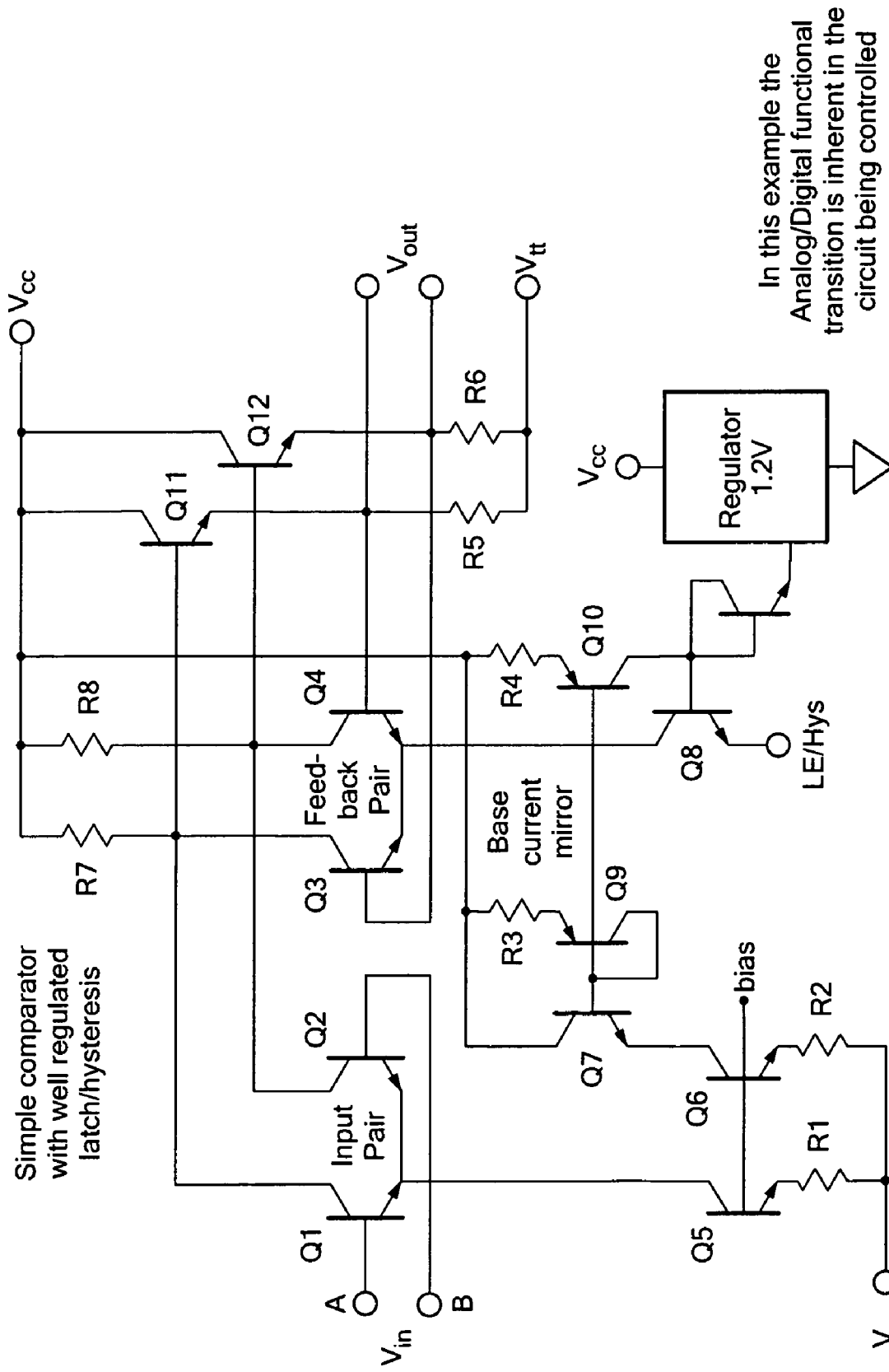
FIG. 2 is a schematic diagram showing an application of the control pin electronics used with a comparator.

FIG. 2 is a schematic diagram showing an application of the control pin input electronics as used with a comparator. The control pin electronics allow for the setting of hysteresis for the comparator and also allows for the creation of a latch. The circuit as shown includes thirteen separate transistors. Q1 and Q2 are the input transistors to the comparator and define a comparison module. If the control pin is not attached and therefore floats, the comparator operates as a standard comparator wherein the voltage on Q1 is compared to the voltage on Q2. The differential transistor pair Q1 and Q2 appears as if the pair is only coupled to an emitter follower pair Q11 and Q12 defining an output module for the comparator. Thus, if the voltage at the base of Q1 increases turning Q1 on, the voltage at the output becomes positive when the emitter base junction of Q11 exceeds the turn-on voltage for the transistor Q11. If the voltage at the base of Q2 is greater than the voltage at the base of Q1, transistor Q2 is more on than Q1 and therefore the base voltage of Q12 decreases. At the same time Q11 is turned on as Q1 shuts off. Thus, Vout produces a negative voltage.

If the voltage at the inputs A and B are close in value, to avoid fluctuations, the comparator benefits from hysterisis. Thus, a current is induced at the control pin. Depending on the desired hysterisis point the current can be varied. For example, a resistor coupled on one side to the control pin and on the other side to GND produces the current. The desired current is easily determined because the control pin has a regulated voltage. Voltage regulator produces a constant 1.2V as shown in the Fig. The voltage regulator may produce other regulated voltages without deviating from the scope of the invention. This 1.2V is presented at the emitter of transistor Q8. Thus, by attaching a resistor coupled to a lower voltage than 1.2V a current is produced. This induced current can be varied by changing the size of the attached resistance. The induced current determines the amount of current that flows through transistor pair Q3 and Q4. Transistor pair Q3 and Q4 define a feedback module. The feedback transistor Q3 re-enforces the state of Q1 and transistor Q4 re-enforces the state of Q2. If input voltage A is greater than input voltage B, the voltage at the base of Q11 decreases as the voltage at the base of Q12 increases. As the base of Q11 decreases, the voltage at the node coupled to the base of Q4 increases turning on Q4 and allowing current to flow through R8. The greater the current through R8, the more that the base voltage of Q12 increases. Thus, the feedback loop including Q3 re-enforces the voltage state of Q1. Similarly if the voltage at input B is greater than the voltage at input A, the voltage at the base of Q12 decreases shutting down Q12. At the same time voltage at the base of Q11 increases and the base of Q4 is pulled down. The base voltage of Q3 increases and current flow through R7 increasing the base voltage of Q11. Thus, the feedback loop including Q4 re-enforces the state of Q2.

The control pin of the comparator may also be used to latch the input signal. Thus, a digital signal could be latched. To create a latch, an input voltage is applied to inputs A and B. The control pin is initially coupled a voltage that is greater than that of the regulator in order to reverse bias Q8. Thus, the circuit operates as a basic comparator. When the input signal is to be captured, the transistors of the feedback module must overpower the transistors in the comparison module. This is accomplished by forward biasing the control pin and providing a greater current at the emitter junction of the feedback module as compared to the current at the emitter junction of the comparison module. Thus, if the current is an order of magnitude larger, the feedback path and the feed back module will control the base voltages of Q11 and Q12 the output module. So if voltage A is in a high state say at 5V and voltage B is at 0 volts, when the control pin is forward biased and receives the relatively large current, the feedback transistors latch the voltage at that time. Since the current is so much greater through the feedback module than through the comparison module, changes to the inputs of the comparison module do not effect the output voltage. Thus, the circuit behaves as a latch.

The control pin electronics also includes a current limiter module. The current limiter is used to prevent a digital input signal producing a large current from destroying the electronics. As shown in FIG. 2, the current limiter module is a current mirror. A bias voltage biases transistors Q5 and Q6. The current that passes through Q6 is mirrored through Q10 and becomes the limiting current for the current limiter. As the current into the control pin increases, more of the current flows into the base of Q8 rather than flowing through Q13 and into the regulator. When the current into the control pin becomes equal to the current through Q6 (mirrored through Q10), the current becomes limited, because no additional current into the base of Q8 is possible limiting the current passing between the base and emitter of Q8. Thus, the current through Q6 limits the current through Q8. The transistors and resistors of the current mirror are preferably matched. For example transistor Q6 and Q8 should be matched along with transistor Q7. Transistors Q9 and Q10 should be matched and resistors R3 and R4 should be matched, in order to produce a current limiter having a low error between the desired current limit through Q6 and the actual current passing through Q8.

Figure 2A:
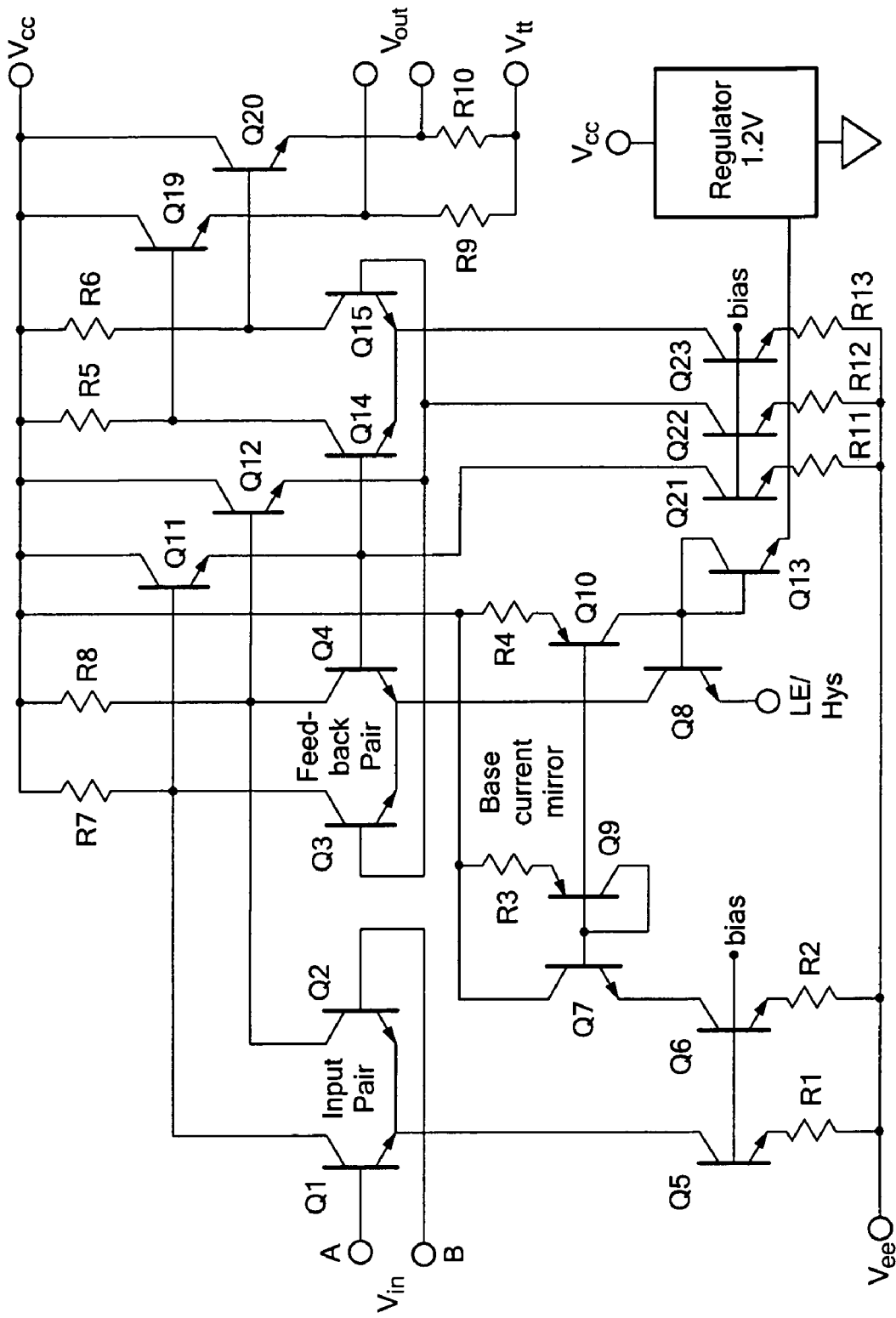
FIG. 2A is an alternative schematic of FIG. 2 including a PECL output stage.

FIG. 2A is an alternative embodiment of the comparator structure with control pin electronics for providing both latching an hysteresis within the same pin. The embodiment of FIG. 2A includes a PECL (Positive Emitter Coupled Logic) output stage. The PECL output stage prevents the latching and hysteresis from shifting the output levels. The output levels are now controlled by the current through transistor Q23. Transistors Q21 and Q22 provide bias current for transistors Q11 and Q12 that are emitter followers in this embodiment.

Figure 2B:
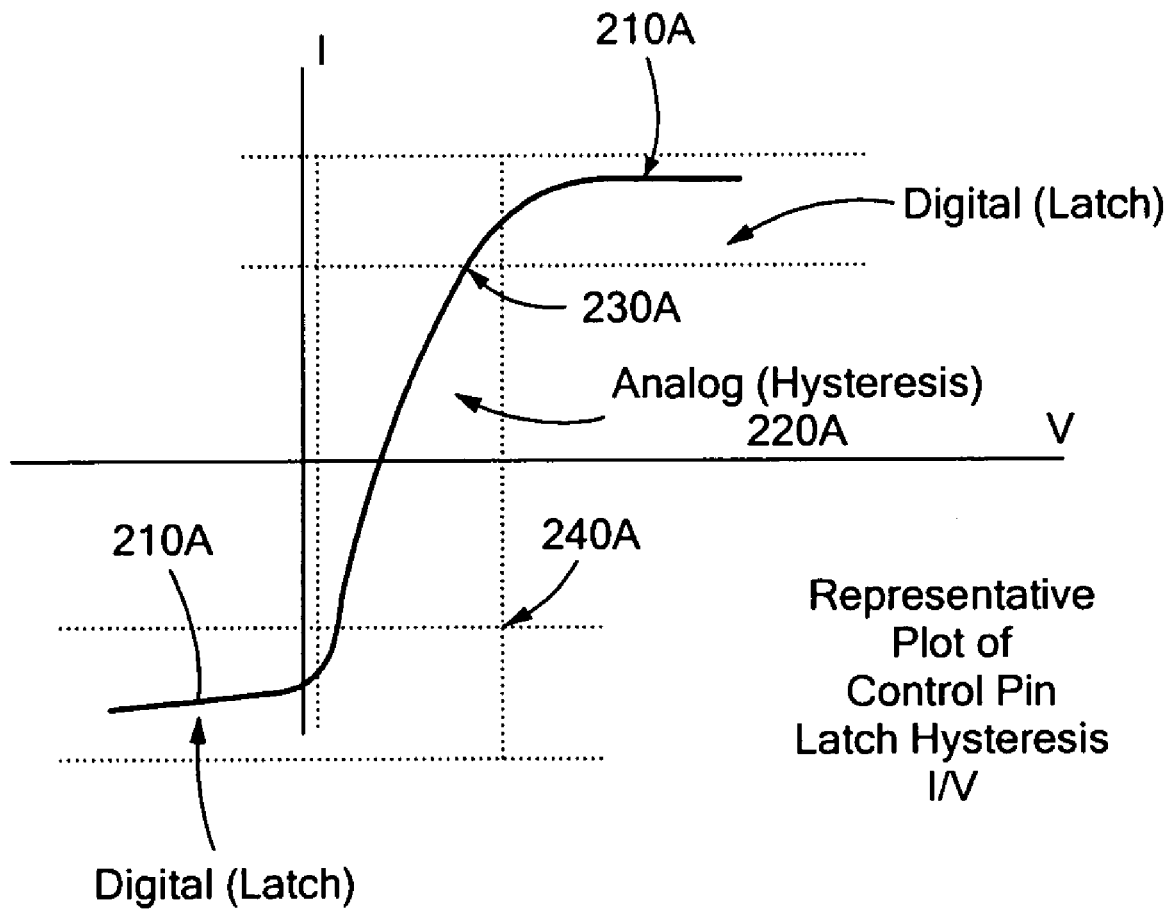
FIG. 2B shows a graph of the I/V transfer function for a comparator, such as that shown in FIG. 2.

FIG. 2B shows a graph of the I/V transfer function for a comparator, such as that shown in FIG. 2, having an embodiment of the control pin electronics including a voltage regulator and a current limiter. The graph shows the operating regions for both analog input signals and for digital input signals to the control pin. In the embodiment represented in the figure, regions of the I/V transfer function for the digital functionality 210A and the analog functionality 220A do not overlap. However, in certain embodiments, the upper 230A and lower limits 240A of the analog functionality could be the digital functionality. For example, if the analog current range for hysteresis was between +/−100 micro amps, the digital functionality could have two states, the first at 100 micro amps and the second at −100 micro amps. As a result, the digital logic scheme and the analog region must be selected, so as to be compatible. As shown, the current limiter clamps the current. In the analog section of the transfer function 220A, there is a steep slope, wherein small changes to the voltage cause the output to have a rapid change toward the current limit.

Figure 3:
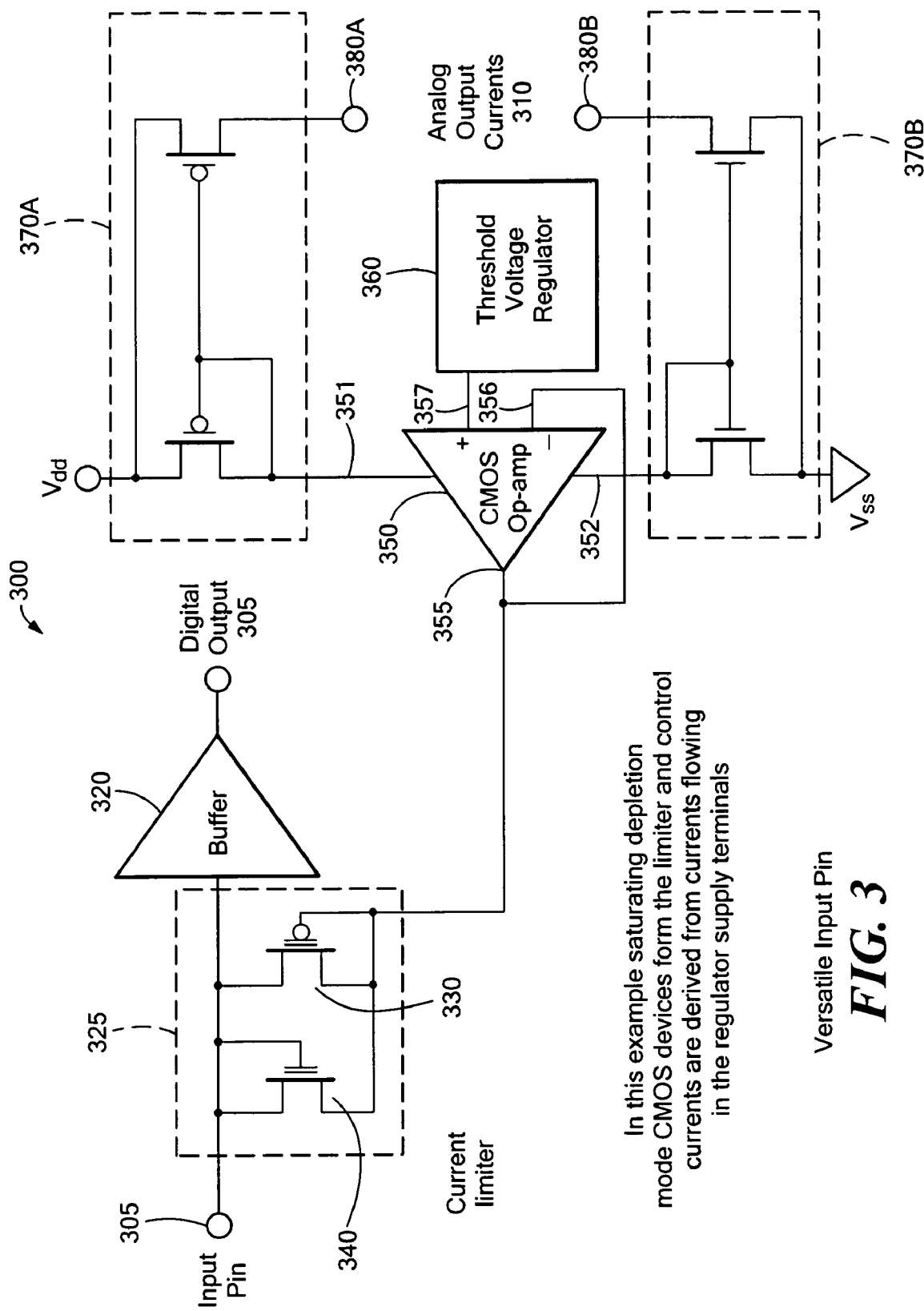
FIG. 3 is a schematic of another version of the control input pin electronics in which CMOS transistors are used rather than bipolar standardize transistors.

FIG. 3 is a schematic of another version of the control input pin electronics 300 in which CMOS transistors are used rather than bi-polar transistors. In this embodiment there are two outputs, one a digital output 305 and the second an analog output 310. In the comparator version of FIG. 2, the control pin has only a single output for both the analog and the digital signals wherein the output feeds into the emitter pair of the feedback module.

The digital path of the circuit flows through a buffer 320 to a digital output. The analog path flow from the input pin into a current limiter constructed from a PNP 330 and an NPN 340 transistor pair. The transistors have their base and drain coupled together and are sized to a limit the current to a desired maximum current. The output of the current limiter is coupled to the output of a CMOS operational amplifier 350. The output 355 of the operational amplifier is fed back to the negative input 356 and the positive input 357 is fed by a voltage regulator 360 that regulates the voltage to a desired voltage level. This desired voltage level is present at the input to the control pin. Coupled to the positive and negative voltage supply terminals of the CMOS operational amplifier 350 are a pair of current mirrors 370A, 370B. Each of the outputs of the current mirror are coupled to one of the analog output terminals 380A, 380B.

If an analog signal having a predefined current range below the threshold for the current limiter 325 is provided as an input to the control pin 305, the large impedance of the buffer 320 forces the current through the low impedance current limiter 325. The current is directed into the negative terminal 356 of the operational amplifier 350. In order to produce the requisite power for this current, the CMOS operational amplifier 350 draws a proportional amount of current through the voltage supply terminals 351, 352. The current mirrors 370A, 370B coupled to the voltage supply terminals 351, 352 replicate the current at the analog output 310.

If a digital signal having a predefined current above the threshold for the current limiter 325 is provided as an input to the control pin 305, the current limiter 325 limits the current and the buffer 320 provides a high impedance. As such, the voltage can vary significantly. Thus, the fluctuation in voltage is used as a representation of the digital signal. When the current limiter limits the current for the control pin electronics, the current stays nearly constant while the voltage varies. In the analog range the voltage and current vary in a substantially linear fashion. Thus, by having a well regulated input voltage and a current limiter, the control pin and accompanying electronics can support both analog and digital inputs.

Figure 4:
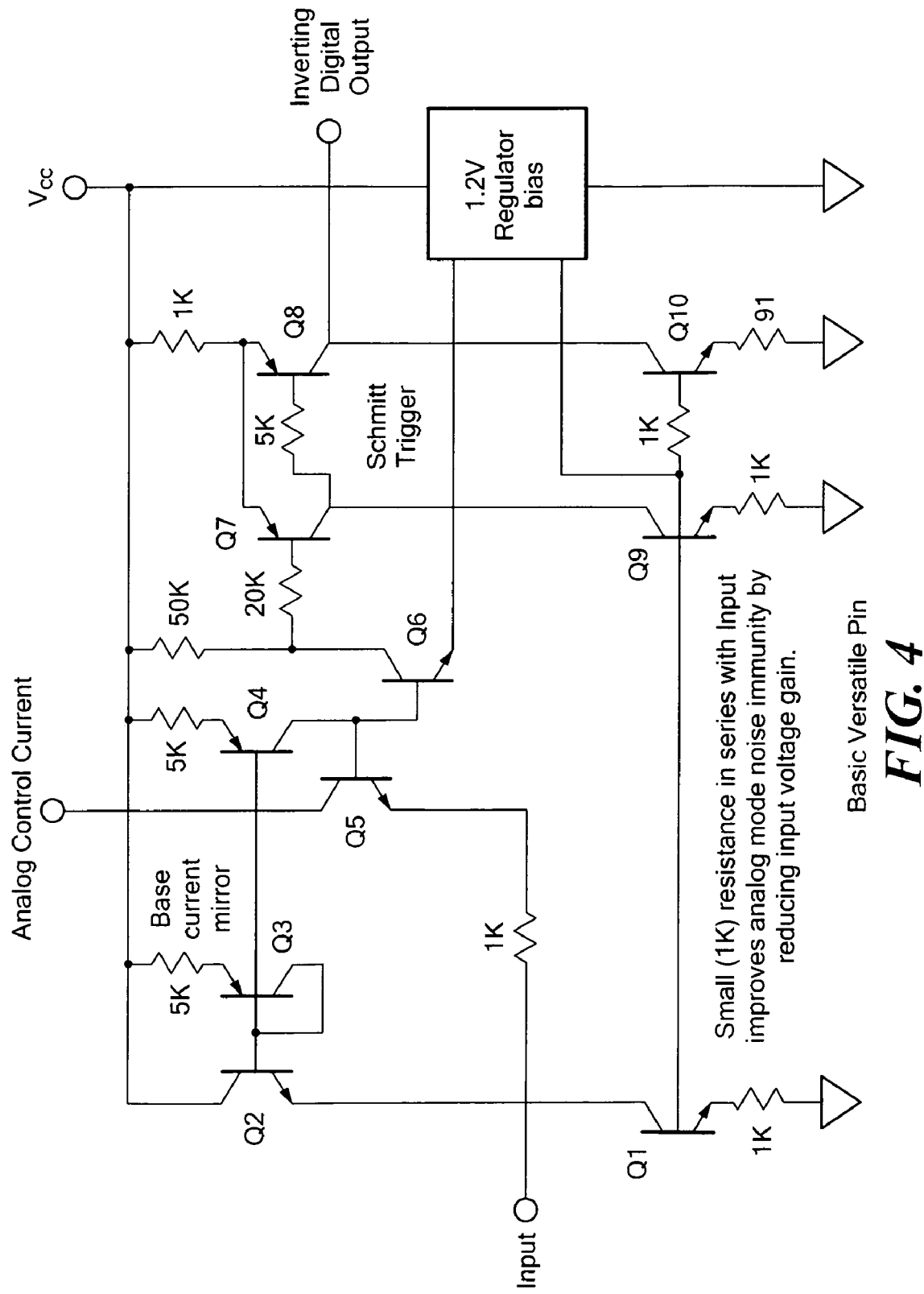
FIG. 4 shows a circuit schematic of the control pin electronics implemented with bipolar transistors and having both an analog and a digital output.

FIG. 4 shows a circuit schematic of the control pin electronics implemented with bipolar transistors and having both an analog and a digital output. This embodiment includes a voltage regulator producing a constant 1.2 volts. Voltage regulators producing other voltage levels may be substituted without deviating from the intent of the present invention. Due to the voltage regulator, the base of transistor Q6 is set to a regulated 1.8V and the emitter of Q5, because of the voltage drop across the base emitter junction is set to a regulated 1.2V. Thus, if this embodiment is coupled to a comparator, the well regulated voltage at the input pin allows for varying the analog control current, which would be coupled to the feed back module of FIG. 2. When the pin is used with a digital input signal of a digital logic family, the current produced by the input digital signal may exceed the current for the analog electronics. Therefore, the control pin electronics includes a current limiter to limit the current to a predetermined value compatible with the analog electronics. The current flowing through transistor Q2 is used as the limiting current. Q2 is part of a current mirror in which the current flowing through Q2 is mirrored through Q4 by Q3. The current coming out of the collector of Q4 flows either into the base of transistor Q5 or Q6. If current is being forced into the circuit at the input, more of the current from Q4 flows into the base of Q5 in order to keep Q5 active. The current that can flow through Q5 is limited when all of the current from Q4 flows into the base of Q5. Thus, the current mirror creates a current limiter at the base of Q5. As already stated, this prevents excessive current from flowing into the analog electronics coupled to the analog control current pin (analog output).

If a digital input signal is received at the input of the control pin, the control pin electronics produces an inverted digital output signal. When the input signal is a low voltage, the base of Q5 is pulled low causing the collector of Q6 to go high. When the collector of Q6 goes high, Q7 shuts down causing the voltage at the collector of Q7 to go higher and turning Q8 on. Therefore, there is a current flowing to the digital output, which would be a high voltage level if a resistor was coupled to the output. If the input is a high voltage level, the base of Q5 and Q6 is driven high. Q6 turns on pulling the collector to a lower voltage. This causes Q7 to turn on and current is taken away from Q8 between Vcc and the emitter of Q7. As a result, the base of Q8 is driven low and the Q8 turns off. Thus, the output from the digital output is a low signal.

Figure 5:
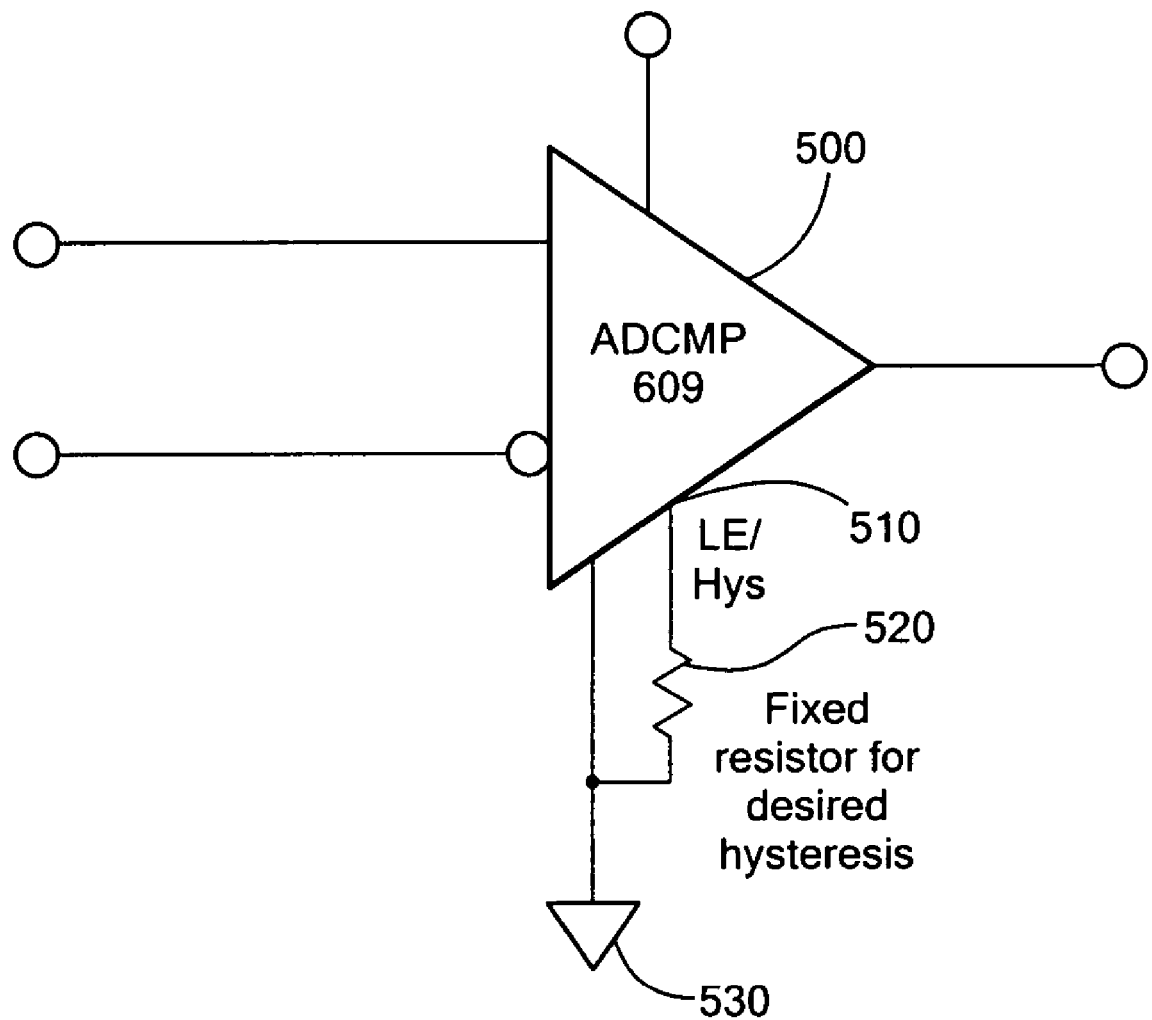
FIG. 5 shows an application circuit using an embodiment of the control pin with control pin electronics.

FIG. 5 shows an application circuit using an embodiment of the control pin 510 with control pin electronics. In this circuit, the control pin electronics are coupled to a comparator 500, such as, that shown in FIG. 2. The control pin 510 in this embodiment is used solely for providing hysteresis. A fixed resistor 520 is coupled between the control pin 510 and a grounding pin 530. Since the control pin electronics include both a current limiter and voltage regulation at the control pin, a well defined current can be presented to the control pin and therefore, the amount of hysteresis can be set. The voltage range over which the control pin shifts between one of the two states can be increased by increasing the size of the resistor and thus, increasing the current. The maximum hysteresis (having the greatest voltage range) is equal to the limiting current.

Figure 6:
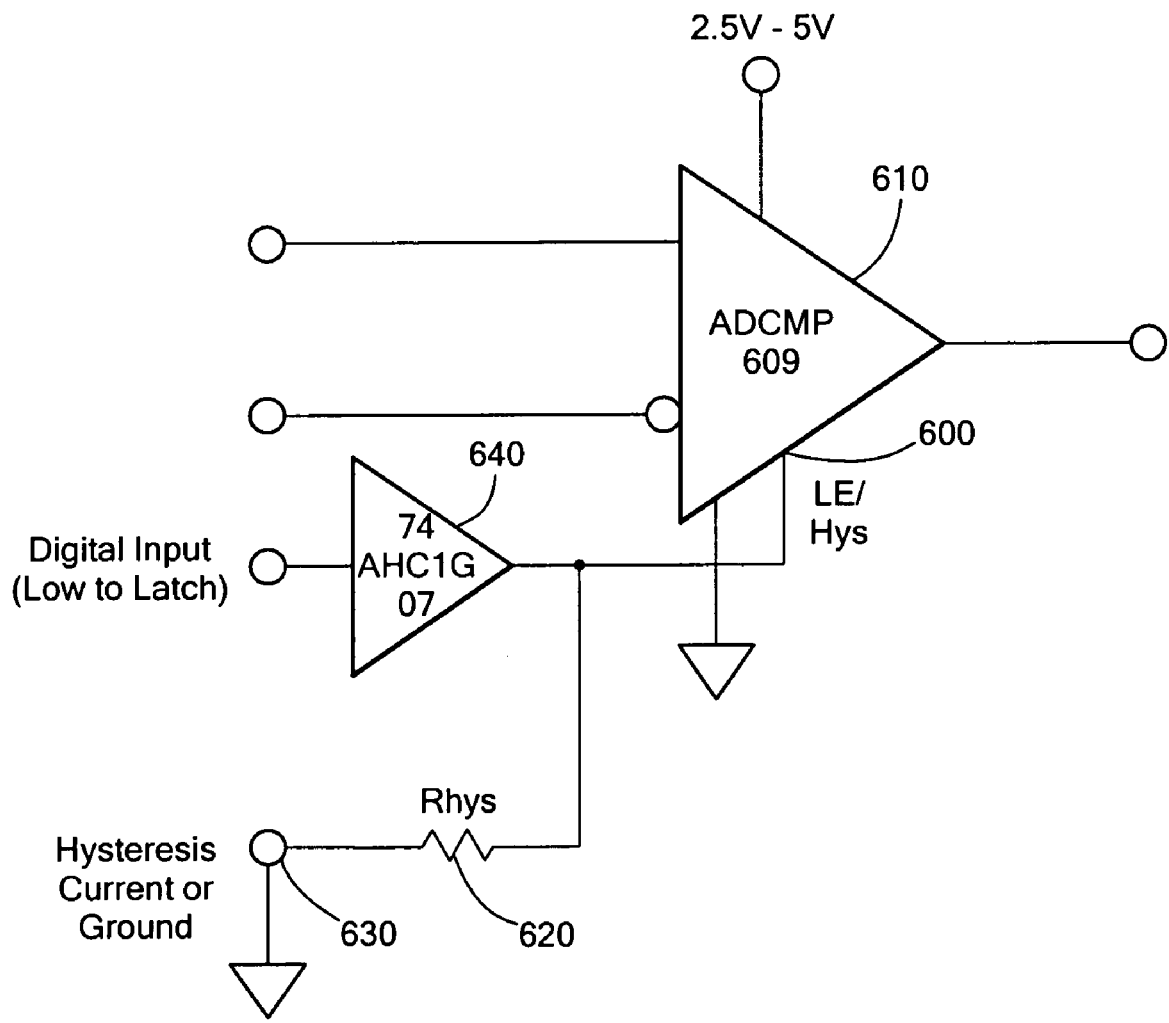
FIG. 6 is another application circuit schematic in which the control pin and control pin electronics are coupled to a comparator, such as that shown in FIG. 2.

FIG. 6 is another application circuit schematic in which the control pin 600 and control pin electronics are coupled to a comparator 610, such as that shown in FIG. 2. Although reference is made to the comparator in FIG. 2 for the application circuits of FIGS. 5 and 6, other comparators may also be substituted. In this circuit the control pin 600 provides both hysteresis (for analog signals) as well as latching (for digital signals). As before, in FIG. 5, hysteresis is controlled by a resistor 620 coupled between the control pin 600 and a grounding pin 630. If a digital latching function is desired, an open drain buffer 640 is also coupled to the control pin 600. The open drain buffer allows the hysteresis current to pass when the digital input signal is high (positive voltage). When the digital input signal goes low the open drain buffer 640 sinks the hysteresis current to a lower potential, such as, ground. The low voltage input at the control pin causes the regulated voltage to be pulled down and the maximum current to flow into the control pin as limited by the current limiter of the control pin electronics. As shown in FIG. 2, if a large/maximum current is fed into the emitters of the feedback module, the transistors of the feedback module overwhelm the transistors of the comparison module and cause the output to lock to the current value. Thus, the control electronics allow for the control pin to provide both latching and hysteresis in a single pin.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

What is claimed is:

1. A comparator having a control pin module allowing for latching an input signal or setting hysteresis for the comparator, the control pin module comprising:
   a control input pin for receiving a control signal having an associated voltage and current;
   a voltage regulator for maintaining the control input pin at a predetermined voltage;
   a current limiter for limiting the current through the control input pin to no greater than a predetermined value;
   a comparison module having a first and a second comparator inputs for receiving in a first and a second input signal, the comparison module producing a comparison module output signal;
   an output module receiving the comparison module output signal and producing a comparator output; and
   a feedback module receiving as a feedback input, the comparator output along with the current through the control pin, and feeding back an amplified comparator output to the output module to regulate the comparator output wherein the feedback module may have unity gain.

2. The comparator according to claim 1 wherein the feedback module operates as a latch when a the control input pin receives a digital input signal and operates to cause hysteresis of the comparator output signal when the control input pin receives an analog signal wherein the digital signal produces a current that is at or above the predetermined value of the current limiter.

3. A comparator having a control pin module allowing for latching an input signal or setting hysteresis for the comparator, the control pin module comprising:
   a control input pin for receiving a control signal having an associated voltage and current;
   a voltage regulator for maintaining the control input pin at a predetermined voltage; and
   a current limiter for limiting the current through the control input pin to no greater than a predetermined value, wherein the comparison module includes a differential transistor pair, each transistor having a control terminal, each transistor receiving at the control terminals one of the first and the second input signals;
   wherein the output stage includes a pair of transistors, each transistor having a control terminal, each control terminal of the output stage transistors electrically coupled to one of the transistors in the comparison module; and
   wherein the feedback module includes a pair of transistors, each transistor having a control terminal, each control terminal electrically coupled to one of the transistors in the output module.

4. The comparator according to claim 3, wherein the input of the control pin module is electrically coupled to the transistors of the feedback module.

5. The comparator according to claim 3 wherein the transistors in the comparison module, the feedback module and the output module include bi-polar transistors.

6. The comparator according to claim 3, wherein the current limiter includes a bipolar transistor having a base, emitter and collector;
   wherein the current limiter is a current mirror wherein current from the current mirror defines a maximum current into the base of the bipolar transistor and the bipolar transistor is coupled to the input at its emitter; and
   wherein the voltage regulator includes a diode having an input and an output, the input of the diode coupled to the base of the bipolar transistor, the voltage regulator producing a known voltage at the base of the bipolar transistor and a regulated voltage at the control input pin.

7. The comparator according to claim 6, wherein the transistors of the feedback pair are electrically coupled to the collector of the bipolar transistor.

8. A system including a control pin module, the control pin module for use with an electronic circuit comprising:
   a control input for receiving a control input signal having an associated voltage and current;

a voltage regulator for maintaining the control input at a predetermined voltage;

a current limiter for limiting the current through the control input to no greater than a maximum value; and a comparator coupled to an output of the control pin module;

wherein the comparator includes a comparison module having a first and a second comparator inputs for receiving in a first and a second input signal, the comparison module producing a comparison module output signal;

an output module receiving the comparison module output signal and producing a comparator output; and a feedback module receiving in the comparator output and feeding back the comparator output to the output module to regulate the comparator output, wherein the comparison module includes a differential transistor pair, each transistor having a control terminal, each transistor receiving at the control terminals one of the first and the second input signals;

wherein the output stage includes a pair of transistors, each transistor having a control terminal, each control terminal of the output stage transistors electrically coupled to one of the transistors in the comparison module; and wherein the feedback module includes a pair of transistors, each transistor having a control terminal, each control terminal electrically coupled to one of the transistors in the output module.

9. The system according to claim 8, wherein the input of the control pin module is electrically coupled to the transistors of the feedback module of the comparator.

10. The system according to claim 8, wherein the maximum value of the current limiter can be adjusted by changing a bias voltage for the current limiter.

11. The system according to claim 8, wherein the current limiter includes a current mirror.

12. A system, the system including a control pin module, the control pin module for use with an electronic circuit comprising:

a control input for receiving a control input signal having an associated voltage and current;

a voltage regulator for maintaining the control input at a predetermined voltage;

a current limiter for limiting the current through the control input to no greater than a maximum value;

a digital output;

an analog output;

a switching structure coupled to the current limiter wherein the switching structure directs the input control signal to the analog output if the current of the input signal is below the predetermined current and the switching structure directs the input control signal to the digital output if the current associated with the input signal is above the predetermined current.

13. A method of using a control pin having associated control pin electronics with a comparator where a control input signal into the control pin can be either an analog input signal or a digital input signal, the analog input signal having an associated operational current range and the digital input signal having an operational current range the method comprising:

creating a regulated voltage at the control pin;

providing a control input signal having an associated voltage and current to the control pin;

current limiting the control input signal at the control pin to a predefined current using a current limiter circuit; and outputting the input signal to the electronic circuit wherein the electronic circuit is a comparator;

latching a comparator signal of the comparator if the input signal is a digital input signal wherein if the control input signal is a digital input signal, the operational current range of the digital input is outside of the operational current range for the analog input signal and the operational current range for the digital input signal is at least, in part, less than the predefined current of the current limiter.

14. The method according to claim 13, further comprising:

providing controlled hysteresis to a comparator signal of the comparator if the input signal is an analog input signal.

* * * * *

UNITED STATES PATENT AND TRADEMARK OFFICE
CERTIFICATE OF CORRECTION

PATENT NO. : 7,535,279 B2 Page 1 of 1
APPLICATION NO. : 11/294747
DATED : May 19, 2009
INVENTOR(S) : Crispin Metzler It is certified that error appears in the above-identified patent and that said Letters Patent is hereby corrected as shown below:

In Col. 8, line 15
replace "when a the control"
with --when the control--

Signed and Sealed this

Sixteenth Day of June, 2009

JOHN DOLL
*Acting Director of the United States Patent and Trademark Office*